(12) United States Patent
Hoshino et al.

(10) Patent No.: US 8,940,638 B2
(45) Date of Patent: Jan. 27, 2015

(54) SUBSTRATE WIRING METHOD AND SEMICONDUCTOR MANUFACTURING DEVICE

(75) Inventors: Satohiko Hoshino, Yamanashi (JP);
Hidefumi Matsui, Yamanashi (JP);
Masaki Narushima, Yamanashi (JP)

(73) Assignees: Tokyo Electron Limited, Tokyo (JP);
Iwatani Corporation, Osaka-shi (JP)

( * ) Notice: Subject to any disclaimer, the term of this patent is extended or adjusted under 35 U.S.C. 154(b) by 81 days.

(21) Appl. No.: 13/583,438

(22) PCT Filed: Feb. 23, 2011

(86) PCT No.: PCT/JP2011/053893
§ 371 (c)(1),
(2), (4) Date: Oct. 4, 2012

(87) PCT Pub. No.: WO2011/111524
PCT Pub. Date: Sep. 15, 2011

(65) Prior Publication Data
US 2013/0040459 A1 Feb. 14, 2013

(30) Foreign Application Priority Data
Mar. 9, 2010 (JP) .................. 2010-051736

(51) Int. Cl.
*H01L 21/44* (2006.01)
*H01L 21/768* (2006.01)
*C23C 14/04* (2006.01)
(Continued)

(52) U.S. Cl.
CPC ........ *H01L 21/76814* (2013.01); *C23C 14/046* (2013.01); *C23C 14/221* (2013.01);
(Continued)

(58) Field of Classification Search
None
See application file for complete search history.

(56) References Cited

U.S. PATENT DOCUMENTS

| 6,284,664 B1 | 9/2001 | Kawai |
| 2007/0293047 A1 | 12/2007 | Fukushima et al. |

(Continued)

FOREIGN PATENT DOCUMENTS

| JP | 6 5544 | 1/1994 |
| JP | 2000 100749 | 4/2000 |

(Continued)

OTHER PUBLICATIONS

Shoichi, T., "Visualization and structural analysis of free jet by LIF," National Aerospace Laboratory, TM-741, Total 21 Pages, (Jul. 1997) (with English abstract and partial translation).

(Continued)

*Primary Examiner* — Cheung Lee
(74) *Attorney, Agent, or Firm* — Oblon, Spivak, McClelland, Maier & Neustadt, L.L.P.

(57) ABSTRACT

In a substrate wiring method, copper is embedded all the way to the lowest parts of a wiring pattern formed on a substrate. The method is used to wire a substrate in a processing chamber kept in a vacuum state, the substrate having a wiring pattern formed thereon. The method includes a preprocessing step in which the wiring pattern on the substrate is cleaned using a desired cleaning gas and an embedding step in which, after the preprocessing step, metal nanoparticles are embedded in the wiring pattern using a clustered metal gas.

12 Claims, 6 Drawing Sheets

(51) Int. Cl.
*C23C 14/22* (2006.01)
*H01L 21/02* (2006.01)
*H01L 21/285* (2006.01)
*H01L 23/532* (2006.01)
*C23C 16/02* (2006.01)
*H01L 23/522* (2006.01)

(52) U.S. Cl.
CPC .... *H01L 21/02063* (2013.01); *H01L 21/28556* (2013.01); *H01L 21/76843* (2013.01); *H01L 21/76877* (2013.01); *H01L 21/76898* (2013.01); *H01L 23/53238* (2013.01); *C23C 16/0281* (2013.01); *H01L 23/5222* (2013.01); *H01L 23/53295* (2013.01); *H01L 2924/0002* (2013.01)
USPC ............... 438/675; 438/639; 257/E21.675

(56) References Cited

U.S. PATENT DOCUMENTS

2008/0317947 A1  12/2008  Coiffic
2012/0006782 A1   1/2012  Miyoshi

FOREIGN PATENT DOCUMENTS

| JP | 2002 305161 | 10/2002 |
| JP | 2002 305163 | 10/2002 |
| JP | 2007 317702 | 12/2007 |
| JP | 2009 27157  | 2/2009  |
| JP | 2010 225614 | 10/2010 |

OTHER PUBLICATIONS

International Search Report Issued Apr. 12, 2011 in PCT/JP11/053893 Filed Feb. 23, 2011.

<PREPROCESSING STEP>
CLEANING GAS

<EMBEDDING STEP: FORMATION OF BARRIER MATERIAL>
METAL CLUSTERS

<EMBEDDING STEP: EMBEDDING OF Cu>
METAL CLUSTERS

CLEANING USING CLEANING GAS
↓
EMBEDDING OF BARRIER MATERIAL
↓
EMBEDDING OF Cu

FIG. 4

$$\frac{X_m}{D_0} = 0.67 \times \left(\frac{P_0}{P_s}\right)^{1/2} \quad \cdots \text{(Eq. 1)}$$

FIG. 6

SUBSTRATE WIRING METHOD AND SEMICONDUCTOR MANUFACTURING DEVICE

This application is a Continuation application of PCT International Application No. PCT/JP2011/053893 filed on Feb. 23, 2011, which designated the United States.

FIELD OF THE INVENTION

The present invention relates to a wiring method of a substrate on which a desired wiring pattern is formed and a semiconductor manufacturing device for manufacturing a semiconductor by using the wiring method of the substrate.

BACKGROUND OF THE INVENTION

In recent years, along with the high integration and high performance of a semiconductor integrated circuit (LSI), micron order fine processing technologies have been proposed. In particular, recently, in order to achieve high-speed LSI, a wiring material is being changed from conventional aluminum (Al) alloy to low resistance copper (Cu) or Cu alloy (hereinafter, collectively referred to as Cu).

In a wiring process of the semiconductor manufacture, a wiring pattern is formed by using, e.g., photolithography and reactive ion etching (RIE). On an insulating film on which the wiring pattern has been formed, a barrier metal layer and a Cu seed layer are formed mainly by physical vapor deposition (PVD). Then, Cu is embedded in the wiring pattern by an electrolytic plating method and a Cu film other than a portion embedded in a groove is removed by chemical mechanical polishing, thereby forming a wiring layer (see, e.g., Japanese Patent Application Publication No. 2007-317702).

The wiring forming method is referred to as a damascene method. In case of forming multilayer Cu wiring, in particular, a wiring forming method called a dual damascene structure is also used. In this method, an insulating film is deposited on the lower wiring, and after forming a predetermined via hole and a trench for the upper wiring, Cu serving as a wiring material is embedded in the via hole and the trench. Further, the wiring layer is formed by performing planarization to remove unnecessary Cu of the upper layer by chemical mechanical polishing.

A low-k film (low dielectric constant material film) may be used as the interlayer insulating film. Accordingly, by using a low-k film with a dielectric constant lower than that of a silicon oxide film, it is possible to reduce the parasitic capacitance between wires. When forming Cu wiring, a barrier metal film is formed between Cu and the low-k film in order to prevent Cu from diffusing into the low-k film.

In this case, in order to embed Cu in the via hole or trench by an electrolytic plating method, it requires a seed film serving as a cathode. However, if a via hole diameter or trench width becomes narrower with high integration, there may occur a region where a Cu seed film is not formed especially in the vicinity of the bottom of the groove. Consequently, in this region, Cu is not plated, which may cause embedding defects.

SUMMARY OF THE INVENTION

In view of the above, the present invention provides a new and improved substrate wiring method and semiconductor manufacturing device, capable of embedding Cu down to a bottom portion of a wiring pattern formed on a substrate.

In accordance with one aspect of the present invention, there is provided a substrate wiring method for wiring a substrate on which a wiring pattern is formed in a processing chamber maintained in a vacuum state, comprising: a preprocessing step in which the wiring pattern on the substrate is cleaned using a desired cleaning gas; and an embedding step in which, after the preprocessing step, metal nanoparticles are embedded in the wiring pattern using a clustered metal gas.

With this configuration, after cleaning a predetermined wiring pattern on the substrate, by ejecting a beam of clustered metal gas toward the wiring pattern, metal nanoparticles are embedded in the wiring pattern. The clustered metal gas has high straightness and directivity. Therefore, by the clustered metal gas having high directivity, even if the via hole diameter or trench width becomes narrow with high integration, it is possible to embed the metal nanoparticles down to the bottom of the wiring pattern which is narrow and deep. In this state, by growing nanostructures such as nanowires and nanotubes from the embedded metal nanoparticles, or filling metal in the wiring pattern, it is possible to form the wiring of the substrate.

Further, according to the Cu embedding method, there is no need to form a Cu seed layer because it is not a plating method. Thus, it is possible to form the wiring with no embedding defects.

Further, the clustered metal gas is an aggregate of several millions to tens of millions of molecules. Accordingly, since the clustered metal gas molecules has molecules united together and solidified into a lump, it has the kinetic energy higher than the kinetic energy of each molecule. On the other hand, since the clustered metal gas molecules scatter at the moment when they collide with the inner wall of the wiring pattern, the kinetic energy of the molecules is distributed at the time of the collision, and it does not cause large damage to a wiring pattern layer.

Accordingly, it is possible to suppress the damage due to the collision with the wiring pattern layer by allowing the molecules to scatter by the collision while surely embedding metal nanoparticles of the metal gas in the wiring pattern by the high kinetic energy. In particular, in a case where the wiring pattern layer is a low dielectric constant (low-k) film, a dielectric constant increases by the damage or a pattern width (CD) for wiring increases. However, by using the clustered metal gas, it is possible to reduce the damage when the metal nanoparticles are embedded and prevent the deterioration of the low-k film.

In the embedding step, the clustered metal gas may be formed by ejecting a metal source into the processing chamber from the gas nozzle whose internal pressure $P_S$ is maintained to be higher than an internal pressure $P_0$ of the processing chamber.

The embedding step may include forming a barrier material of metal by embedding the metal nanoparticles in a surface of the wiring pattern, and embedding a wiring metal in the wiring pattern in which the barrier material is formed.

A distance d between the gas nozzle and the substrate may be set to be longer than a distance $X_n$ from an outlet of the gas nozzle to a position where a shock wave is generated, which is defined in the following Eq. 1:

$$\frac{X_m}{D_O} = 0.67 \times \left(\frac{P_O}{P_S}\right)^{\frac{1}{2}} \quad \text{Eq. 1}$$

where $D_O$ is an inner diameter of the outlet of the gas nozzle, $P_S$ is an inner pressure of the gas nozzle, and $P_O$ is an inner pressure of the processing chamber. The barrier material may be formed by allowing the metal nanoparticles to collide with the substrate using the generated shock wave.

The inner pressure $P_S$ of the gas nozzle may be equal to or greater than 0.4 MPa, and the internal pressure $P_0$ of the processing chamber may be equal to or less than 1.5 Pa.

The inner pressure $P_S$ of the gas nozzle may be equal to or less than 0.9 MPa.

The substrate wiring method may be used in a wiring process in a semiconductor chip or a wiring process between semiconductor chips.

In accordance with another aspect of the present invention, there is provided a semiconductor manufacturing device for wiring a substrate on which a wiring pattern is formed in a processing chamber maintained in a vacuum state, comprising: a gas nozzle whose internal pressure $P_S$ is maintained to be higher than an internal pressure $P_0$ of the processing chamber, wherein the semiconductor manufacturing device performs a preprocessing step in which the wiring pattern on the substrate is cleaned using a desired cleaning gas; and an embedding step in which, after the preprocessing step, a clustered metal gas is generated by ejecting a metal source into the processing chamber from the gas nozzle and metal nanoparticles are embedded in the wiring pattern using the clustered metal gas.

As described above, in accordance with the present invention, by embedding Cu down to the bottom of the wiring pattern formed on the substrate, it is possible to form wiring with no embedding defects.

DETAILED DESCRIPTION OF THE EMBODIMENTS

Hereinafter, an embodiment of the present invention will be described with reference to the accompanying drawings which form a part hereof. Throughout the specification and drawings, like reference numerals will be given to like parts having substantially the same function and configuration, and redundant description thereof will be omitted.

[Configuration of Cluster Apparatus]

First, a schematic configuration of a cluster apparatus in accordance with an embodiment of the present invention will be described with reference to FIG. 1. A cluster apparatus 10 includes a vacuum processing chamber 100 for airtightly accommodating a wafer W. The processing chamber 100 is divided by a barrier member 120 into a gas supply space 100a and a processing space 100b. Exhaust ports 105a and 105b are respectively formed at bottom walls of the gas supply space 100a and the processing space 100b to evacuate the respective spaces, and exhaust pumps (not shown) are respectively connected to the exhaust ports 105a and 105b.

A gas nozzle 110 is provided at a sidewall of the gas supply space 100a. The gas nozzle 110 is positioned to be opened toward a target object, so that a gas ejected from the gas nozzle 110 has directivity. A metal source 115 generates a metal gas. The generated metal gas is ejected into the gas supply space 100a through an outlet 110a of the gas nozzle 110. As a method for generating a metal gas from the metal source 115, for example, there is a method using a precursor for metal organic chemical vapor deposition (MOCVD) or a method for dissolving and vaporizing the metal source 115 by arc discharge.

The metal gas ejected from the gas nozzle 110 is clustered. This mechanism will be described. The gas nozzle 110 is set such that an internal pressure $P_S$ thereof ranges from 0.4 MPa to 0.9 MPa. Meanwhile, the processing chamber 100 is vacuum evacuated so that its internal pressure $P_0$ is equal to or less than 1.5 Pa. The metal gas g is ejected into the processing chamber 100 from the gas nozzle 110 whose internal pressure $P_S$ is maintained to be higher than the internal pressure $P_0$ of the processing chamber 100.

In this way, if the metal gas g with high reactivity is ejected from the higher-pressure gas nozzle 110 into the lower-pressure processing chamber 100, the pressure difference therebetween causes the temperature of the metal gas g to be quickly decreased, so that molecules of the metal gas are united together and solidified into a lump. In this manner, the metal gas g ejected into the processing chamber 100 from the gas nozzle 110 is clustered. The clustered metal gas (hereinafter, referred to as "metal gas clusters Cg") is an aggregate of relatively weakly boned molecules the number of which ranges from several millions to several tens of millions.

As mentioned above, the metal gas clusters Cg have directivities, but some of the metal gas clusters Cg do not fly straight. If these metal gas molecules fly to the wafer W and collide with the wafer W, the etching process may be carried out in an unexpected direction. For that reason, the barrier member 120 is provided between the gas nozzle 110 and the wafer W to prevent the non-straight flying metal gas clusters Cg from colliding with the wafer W. The barrier member 120 has a hole 120a, so that the metal gas clusters Cg are introduced into the processing space 100b through the hole 120a.

In the processing space 100b, a holding member 155 is provided to hold the wafer W. The holding member 155 holds the wafer W such that the metal gas clusters Cg collide with the surface of the wafer W perpendicularly. A moving member (not shown) for moving the holding member 155 is provided to the holding member 155. By the movement of the moving member, the metal gas clusters Cg are supplied uniformly over the entire surface of the wafer W in a direction perpendicular to the surface of the wafer W.

With this configuration, the wafer W can be etched in a good shape because an etching reaction proceeds only in a portion where thermal energy is generated by the collision of the metal gas clusters Cg. The metal gas clusters Cg do not cause the etching reaction in a portion where there is no thermal energy. On the wafer W of FIG. 1, a layer F and a hole H formed in the layer F are illustrated behind a mask M. The metal gas clusters Cg have directivity and hardly collide with a sidewall Ha of the deeply formed hole H. Thus, no thermal energy is generated at the sidewall Ha of the hole H. For this reason, the sidewall Ha of the hole H is not etched generally. On the other hand, the metal gas cluster Cg collide with a bottom portion Hb of the deeply-formed hole H, thereby etching the bottom portion Hb. In this way, in accordance with the present embodiment, it is possible to form a thin and deep hole in a good shape.

In addition, with this configuration, it is possible to realize a process that inflicts no electrical damage on the wafer W. In a conventional process, a reactive gas is ionized by a plasma. The thus-ionized gas has electric energy, and the ionized gas may electrically damage the wafer W. However, in the cluster apparatus 10 in accordance with this embodiment, the metal gas clusters Cg are not ionized. For this reason, during the etching process, it is possible to perform the process without causing electrical damage to the wafer W.

In addition, with this configuration, since the metal gas clusters Cg are not ionized, the cluster apparatus is not required to be equipped with a plasma source. Accordingly, the cluster apparatus becomes simplified, thereby making the maintenance easy, lowering the manufacturing cost and having an appropriate structure for the mass production.

[Collision of Clustered Molecules]

Next, a collision state of the clustered metal gas will be described with reference to FIG. 1. As mentioned above, the metal gas shown in FIG. 1 is ejected into the processing chamber 100 from the gas nozzle 110, and clustered. The clustered metal gas (metal gas clusters Cg) is an aggregate of molecules ranging in number from several millions to several tens of millions. Since the clustered metal gas has molecules united together and solidified into a lump, it has kinetic energy higher than the kinetic energy of each molecule.

On the other hand, since the molecules of the metal gas clusters Cg scatter at the moment when they collide with the wafer W, the kinetic energy of the molecules is distributed at the time of the collision, and it does not cause large damage to a wiring pattern layer.

Accordingly, it is possible to suppress the damage due to the collision with the wiring pattern layer while surely embedding metal nanoparticles of the metal gas in the wiring pattern by the collision. In particular, in a case where the wiring pattern layer is a low dielectric constant (low-k) film, a dielectric constant increases by the damage or a pattern width (CD) of wiring increases. However, by using the metal gas clusters Cg, it is possible to reduce the damage when the metal nanoparticles are embedded and prevent the deterioration of the low-k film.

Figure 2A:
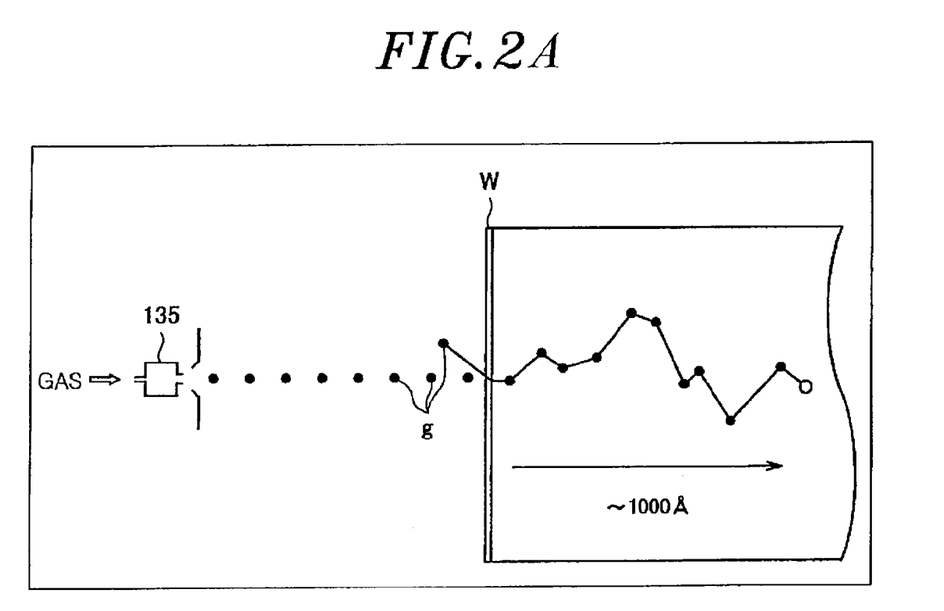
FIG. 2A is a diagram for explaining the damage to the substrate when one molecule collides with the substrate.
Figure 2B:
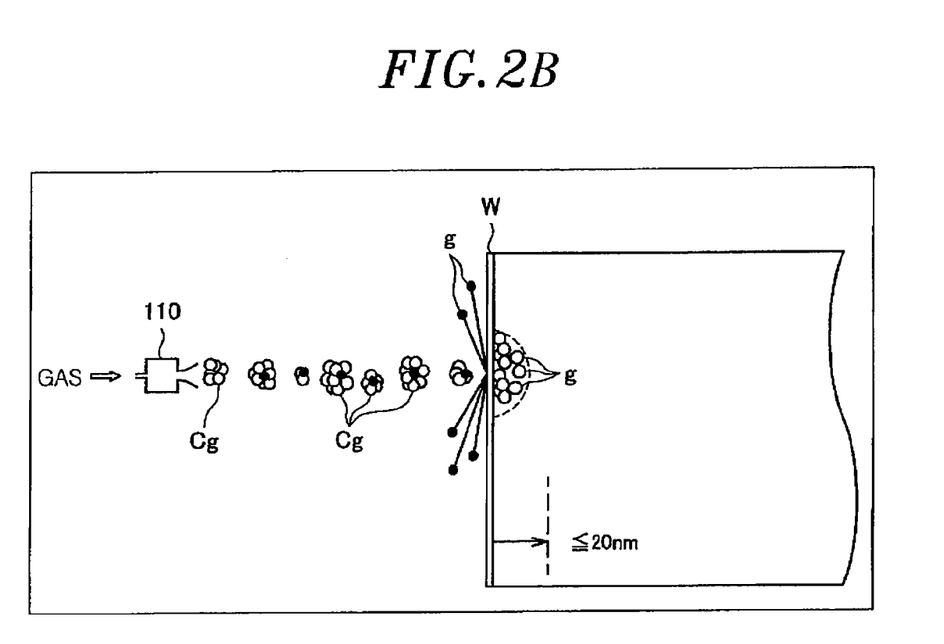
FIG. 2B is a diagram for explaining the damage to the substrate when the clustered molecules collide with the substrate.

FIG. 2A is a diagram showing the damage to the wafer W when one molecule collides with the wafer W, and FIG. 2B a diagram showing the damage to the wafer W when the clustered molecules collide with the wafer W. As shown in the diagram of FIG. 2A, a plasma including reactive ions is generated in a plasma source 135. Since the reactive ions are not clustered into an aggregate of the molecules, the energy of one molecule at the time of collision is low, but it can be seen that the collision causes damage to a deep portion of the wafer W. On the other hand, as shown in the diagram of FIG. 2B, a gas that has not been converted to a plasma is ejected from the gas nozzle 110 to generate the clusters Cg. The generated clusters Cg collide with the wafer W at high collision energy, but the molecules scatter at the time of the collision with the film of the wafer W. Accordingly, it can be seen that it causes less damage to the wafer W. Thus, it can be seen that, particularly, in case of the low-k film, it is possible to reduce the damage caused by the collision.

[Wiring Method]

Next, a wiring method in accordance with an embodiment of the present invention will be described with reference to FIG. 3. "Preprocessing step" of FIG. 3 represents a cleaning process of the wiring pattern.

Generally, in a manufacturing process of semiconductor devices, a multilayer wiring circuit is formed in the wafer W by using a damascene method or a dual damascene method using photolithography. In the preprocessing step of FIG. 3, a via hole 24a and a trench 24b serving as a wiring groove are formed in a low-k film 24 that is an upper interlayer insulating film by using a dual damascene method. Under the low-k film 24, a low-k film 20 that is a lower interlayer insulating film, a barrier metal layer 21, a Cu wiring layer 22, and a stopper film 23 are formed.

(Preprocessing Step)

Figure 3:
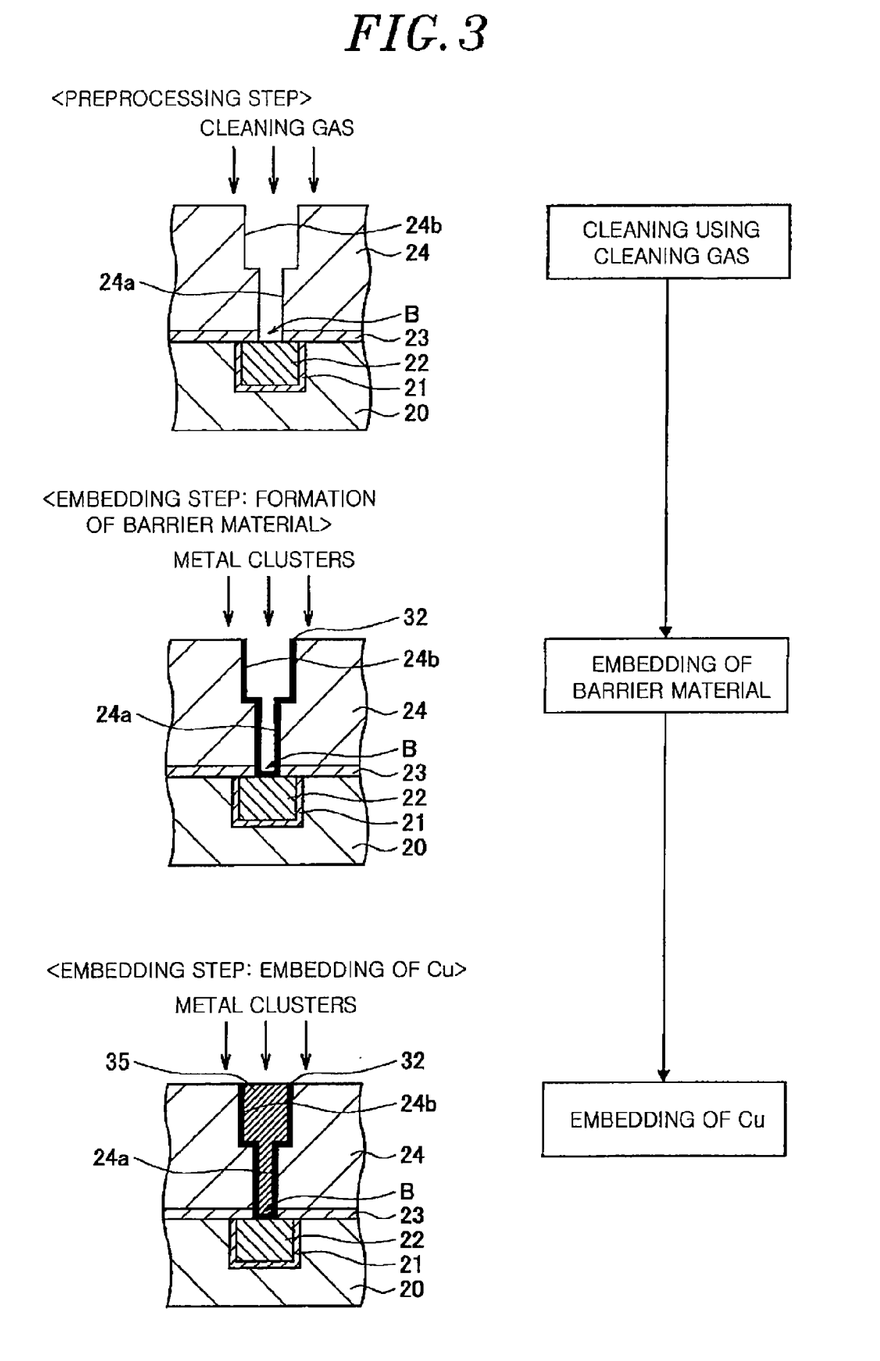
FIG. 3 illustrates a substrate wiring method in accordance with the embodiment of the present invention.

In the preprocess step of FIG. 3, as a preprocessing step of a Cu embedding step, the via hole 24a and the trench 24b are cleaned with a desired cleaning gas. As a cleaning gas, at least one of $NH_4OH$, $H_2O_2$, HCL, $H_2SO_4$, HF and $NH_4F$, or a combination thereof may be used. The wiring pattern is cleaned by using cleaning chemicals such as $NH_4OH$ with high reactivity in a vapor phase.

This cleaning process may be performed by using a plasma or without using a plasma. As an example in which a plasma is not used, a cleaning gas may be ejected from the gas nozzle 110 shown in FIGS. 1 and 2 and used in a clustered state. Since the clustered gas has straightness and directivity, the gas can reach a via bottom B as well as the inner wall of the via hole 24a and the trench 24b, thereby more uniformly cleaning the inside thereof.

(Embedding Step: Formation of Barrier Material)

After the preprocessing step, an embedded step is performed to embed metal nanoparticles in the wiring pattern by using the clustered metal gas (metal gas clusters Cg).

In the embedded step, first, as shown in "embedding step: formation of barrier material" of FIG. 3, a barrier material 32 is formed on the inner wall of the wiring pattern. In this step, the barrier material 32 is formed by embedding metal nanoparticles, and the barrier material 32 becomes dense by using a shock wave.

Figure 4:
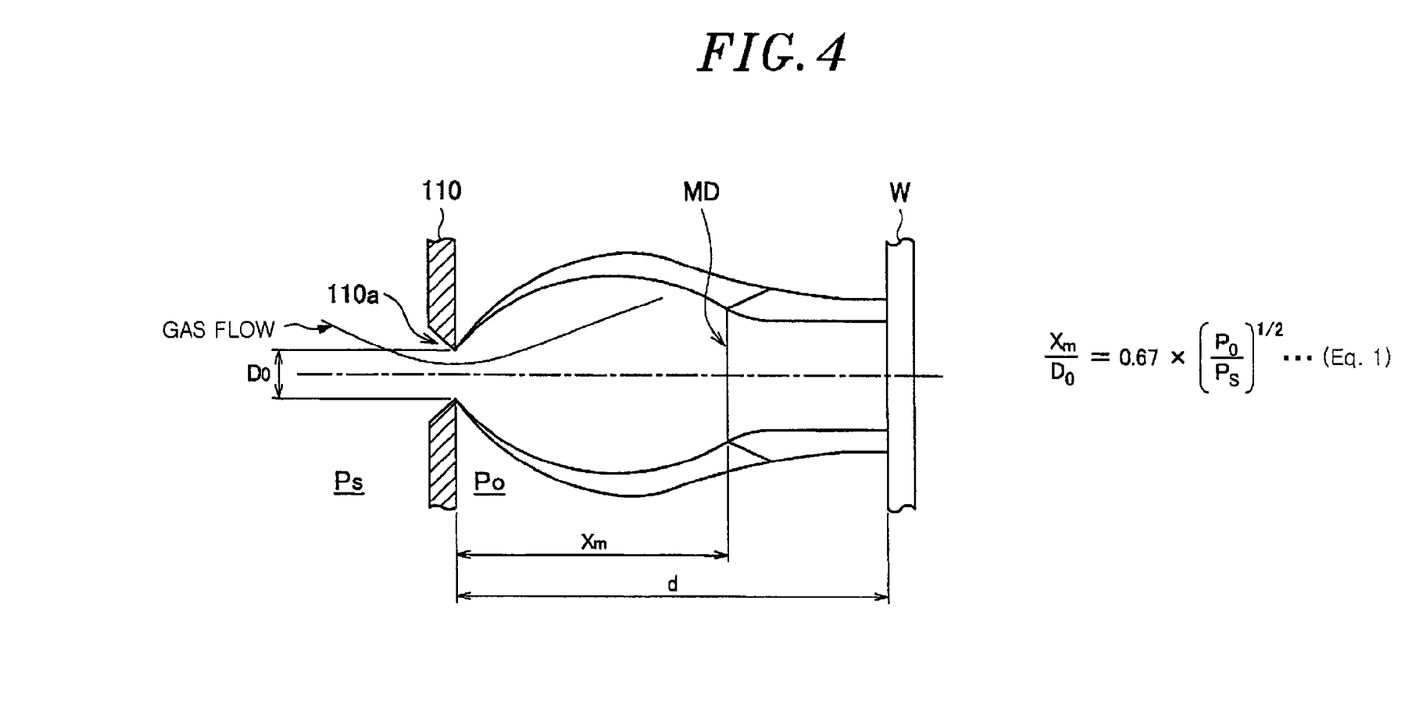
FIG. 4 is a diagram showing a distance from a nozzle outlet to a shock wave in accordance with a modification example of the embodiment of the present invention.

FIG. 4 is a diagram showing a distance from the outlet 110a of the gas nozzle 110 to a shock wave MD (Mach Disc). According to ISSN0452-2982 National Aerospace Laboratory's materials (TM-741), "Visualization and structural analysis of free jet by LIF" (Tsuda Shoichi, National Aerospace Laboratory, July 1997), the following Eq. 1 is established in a distance $X_m$ from the outlet 110a of the gas nozzle 110 to a position where the shock wave MD appears, an inner diameter $D_0$ of the outlet that is a throat part of the gas nozzle 110, an inner pressure $P_S$ of the gas nozzle, and an inner pressure $P_O$ of the processing chamber 100 into which the gas is introduced.

$$\frac{X_m}{D_O} = 0.67 \times \left(\frac{P_O}{P_S}\right)^{\frac{1}{2}} \qquad \text{Eq. 1}$$

In this case, it is preferable that a distance d from the outlet 110a of the gas nozzle 110 to the wafer W is set to be longer than the distance $X_m$ from the outlet 110a of the gas nozzle 110 to the position where the shock wave MD is generated by the gas flow, which is defined in Eq. 1. Accordingly, the barrier material 32 formed uniformly up to the via bottom B can be dense by using a shock wave.

In particular, in this embodiment, as the interlayer insulating film, the low-k films 20 and 24 having a low dielectric constant have been used. When using the low-k film having a dielectric constant k of 2.6 or less compared to a silicon oxide film ($SiO_2$ film) having a dielectric constant k of about 4.2, it is possible to reduce a parasitic capacitance between wires. On the other hand, it is necessary to prevent Cu from diffusing into the low-k film while Cu wiring is formed by a damascene method. For this reason, the barrier material 32 is formed between the Cu wiring layer and the low-k film. In addition, when the barrier material 32 becomes dense by using a shock wave as in the present embodiment, it is preferable because it is possible to surely suppress the diffusion of Cu into the low-k film.

(Embedding Step: Embedding of Cu)

Next, as shown in <embedding step: embedding of Cu> of FIG. 3, a process of embedding Cu in the wiring pattern in which the barrier material 32 is formed is performed. The embedded Cu becomes a wiring layer 35. As a method of embedding Cu in the wiring pattern, the wiring layer 35 may be formed, e.g., by embedding Cu in the wiring pattern by an electrolytic plating method, and removing the Cu film other than a portion embedded in the groove by chemical mechanical polishing. Further, the wiring layer 35 may be formed by growing nanostructures from the metal nanoparticles forming the barrier material 32. Hereinafter, a nanotube manufacturing apparatus for growing nanostructures from the metal nanoparticles will be described in brief.

[Nanotube Manufacturing Apparatus]

Figure 1:
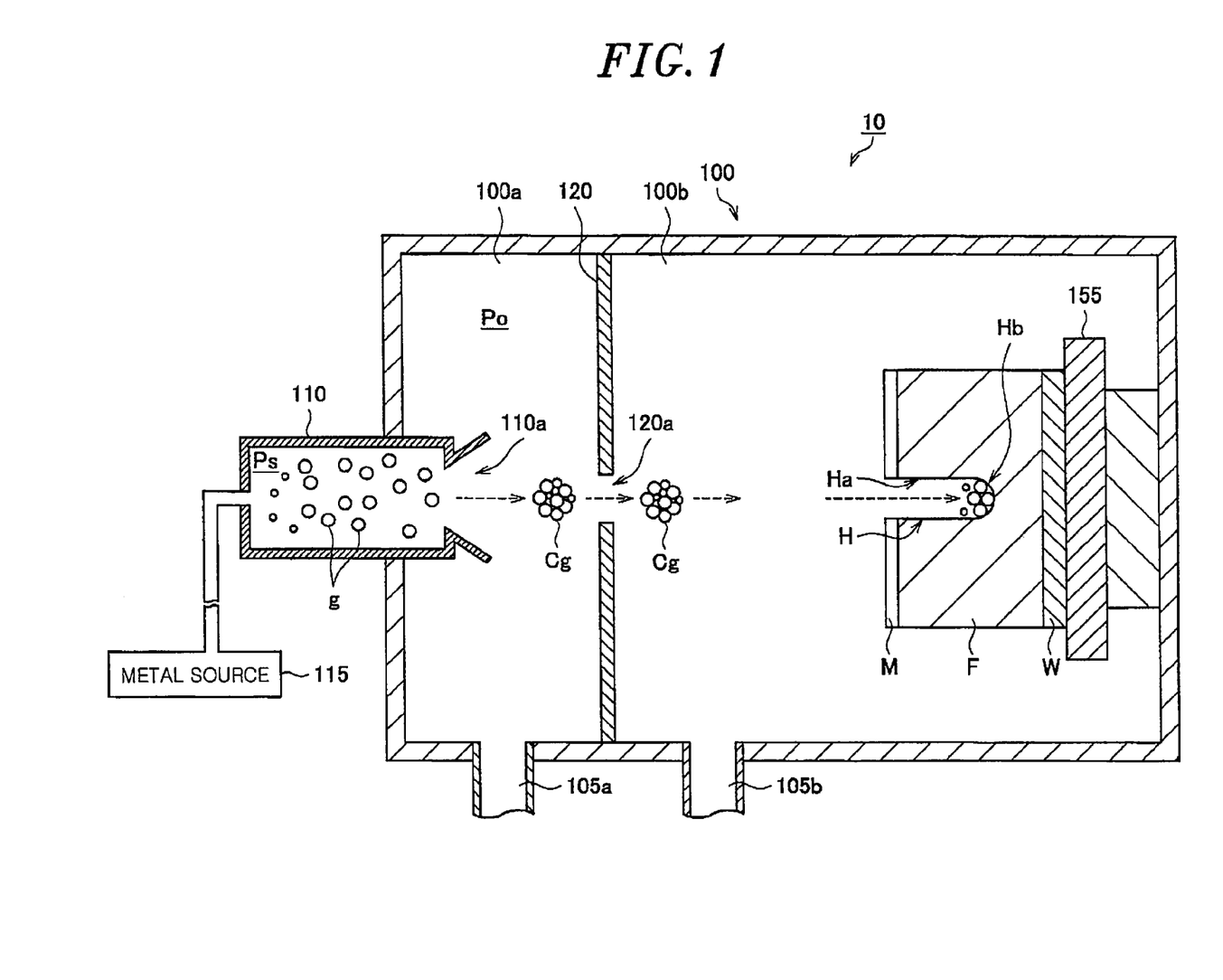
FIG. 1 is a longitudinal cross-sectional view showing a schematic configuration of a cluster apparatus in accordance with an embodiment of the present invention.

The wafer W in which the barrier material 32 of metal nanoparticles has been formed is transferred from the cluster apparatus 10 shown in FIG. 1 into the nanotube manufacturing apparatus while maintaining a vacuum state. The nanotube manufacturing apparatus manufactures nanotubes by growing the metal nanoparticles on the transferred wafer W.

Figure 5:
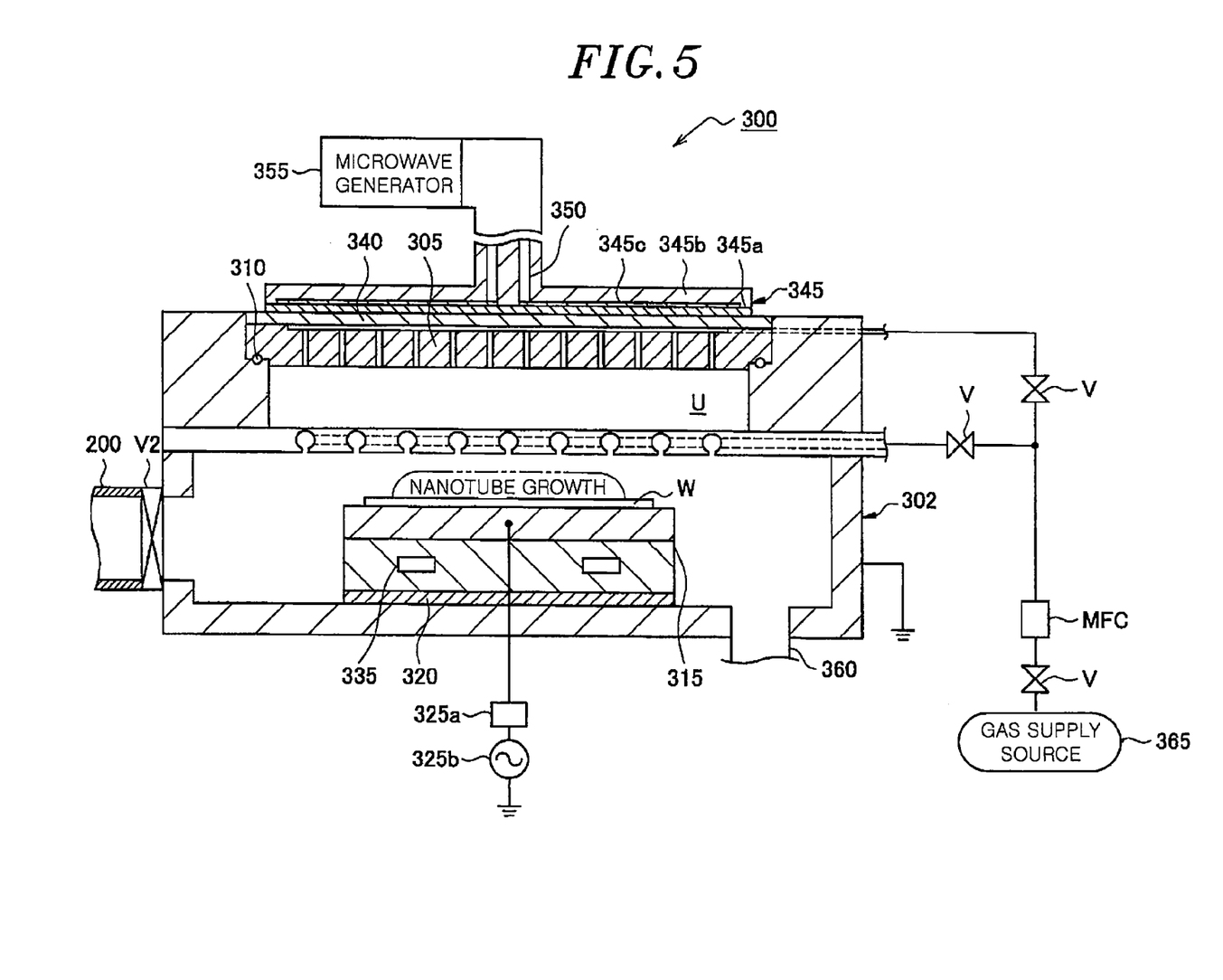
FIG. 5 is a longitudinal cross-sectional view showing a schematic configuration of a nanotube manufacturing apparatus in accordance with the embodiment of the present invention.

FIG. 5 is a radial line slot antenna (RLSA) plasma CVD apparatus serving as the nanotube manufacturing apparatus in accordance with the embodiment of the present invention. Further, a nanotube manufacturing apparatus 300 is not limited to the RLSA plasma CVD apparatus, and various plasma processing apparatuses such as a capacitively coupled (parallel plate type) plasma processing apparatus, an inductively coupled plasma (ICP) processing apparatus, and an electron cyclotron resonance (ECR) plasma processing apparatus may be used.

As described above, the wafer W on which the film formation of the metal nanoparticles Ma has been performed is transferred to a mounting table 315 in the RLSA plasma CVD apparatus (nanotube manufacturing apparatus 300) through a vacuum transfer mechanism (not shown) while maintaining a vacuum state. In the RLSA plasma CVD apparatus, nanotubes are manufactured by growing the metal nanoparticles on the transferred wafer W.

The RLSA plasma CVD apparatus includes a cylindrical reaction vessel 302 whose ceiling surface is opened. A shower plate 305 is inserted into the opening of the ceiling surface. The reaction vessel 302 and the shower plate 305 are sealed by an O-ring 310 that is disposed between a step portion of an inner wall of the reaction vessel 302 and an outer peripheral portion of the underside of the shower plate 305, thereby forming a processing chamber U in which plasma processing is performed. For example, the reaction vessel 302 is formed of metal such as aluminum, and the shower plate 305 is formed of a dielectric material or metal such as aluminum, and electrically grounded.

At the bottom of the reaction vessel 302, a susceptor (mounting table) 315 for mounting the wafer W is installed through an insulator 320. The susceptor 315 is connected to a high frequency power source 325b via a matching unit 325a such that a predetermined bias voltage is applied to the inside of the reaction vessel 302 by a high frequency power outputted from the high frequency power source 325b. Further, a cooling jacket 335 is provided in the susceptor 315 to supply cooling water to cool the wafer W.

The shower plate 305 is covered with a cover plate 340 at its top. A radial line slot antenna 345 is provided on the upper surface of the cover plate 340. The radial line slot antenna 345 includes a disc-shaped slot plate 345a on which a plurality of slots (not shown) are formed, a disc-shaped antenna body 345b holding the slot plate 345a, and a phase delay plate 345c which is provided between the slot plate 345a and the antenna body 345b and formed of a dielectric material such as alumina. A microwave generator 355 is installed at the radial line slot antenna 345 through a coaxial waveguide 350.

A vacuum pump (not shown) is attached to the reaction vessel 302 to discharge the gas in the reaction vessel 302 through a gas discharge pipe 360, thereby maintaining the pressure in the reaction vessel 302 at $10^{-4}$ to $10^{-1}$ Pa. In addition, a plate temperature of the wafer W is kept at about 500 to 850° C. by using the cooling jacket 335 and an electrical heating member (not shown) disposed in the mounting table 315.

A gas supply source 365 is configured to supply a gas of a desired concentration into the reaction vessel 302 by controlling an opening degree of a mass flow controller (MFC) and opening/closing of a valve V.

In this state, a microwave is introduced into the reaction vessel 302 through the waveguide 350. Also, a gas for generating nanotubes is introduced into the reaction vessel 302 from the gas supply source 365. The supplied gas is decomposed by the energy of the microwave and converted into a plasma. The generated plasma collides with the wafer W to react on the surface of the wafer W. Accordingly, nanotubes can be grown by using the metal nanoparticles embedded in the wafer W as a seed.

Further, the growth of the metal nanoparticles may have a shape of tubes or wires. Accordingly, nanotubes or nanowires can be grown by using the metal nanoparticles on the wafer W as a seed.

In this way, nanostructures such as nanotubes are grown by the nanotube manufacturing apparatus 300 in accordance with the embodiment of the present invention. As nanostructures, fullerenes, fullerene derivatives, carbon nanotubes, carbon nanohorns, carbon nanowires or the like may be mentioned primarily.

As described above, in the wiring method in accordance with the embodiment of the present invention, by embedding Cu down to the bottom of the wiring pattern by using metal clusters having high directivity, it is possible to form wiring with no embedding defects.

In particular, in a case where the wiring layer 35 is formed by growing nanostructures using the embedded metal nanoparticles as a seed, since the particle diameter of the metal nanoparticles becomes equal to the thickness of the nanostructures, the thickness of the wiring can be controlled by the particle diameter of the metal nanoparticles.

Application Example

The substrate wiring method in accordance with the embodiment of the present invention may be used in a wiring process between semiconductor chips as well as a wiring process in a semiconductor chip as described above.

Figure 6:
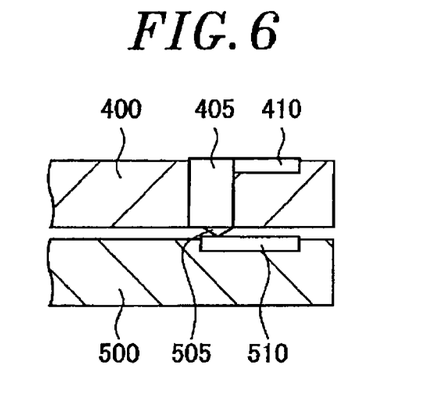
FIG. 6 is a diagram for explaining an example in which the wiring method of the wafer in accordance with the embodiment of the present invention is applied to wiring of through holes.

Recently, there has been proposed three-dimensional wiring technology for electrically connecting upper and lower semiconductor chips using a through-silicon via (TSV) electrode passing through the inside of the semiconductor chip. In FIG. 6, a through hole (TSV) 405 is formed in an upper semiconductor chip 400. Wiring is formed to pass through the through hole 405, and a pad electrode 410 of the upper semiconductor chip 400 is electrically connected to a pad electrode 510 of a lower semiconductor chip 500 via the through hole 405 and a bump 505.

Here, the wiring using the TSV is formed by the substrate wiring method in accordance with the embodiment of the present invention. According to the 3D wiring, it is possible to wire the nanostructures of the thickness equal to the particle diameter of the metal nanoparticles with respect to the TSV having a diameter of 30 μm to 50 μm. In addition, since it is possible to reduce the resistance of the wiring in the package, and form one package by stacking a plurality of semiconductor chips, it is possible to achieve miniaturization, high-speed processing of a system, and a reduction in power consumption.

In the substrate wiring method in accordance with the embodiment of the present invention, since the operations of various parts are related to each other, taking into account a relationship, it can be replaced by a series of operations and a series of processes. Thus, the embodiment of the substrate wiring method may be an embodiment of a semiconductor manufacturing device for substrate wiring.

Accordingly, an embodiment of a semiconductor manufacturing device for wiring a substrate on which a wiring pattern has been formed in a processing chamber maintained in a vacuum state may be implemented such that the semiconductor manufacturing device includes a gas nozzle whose internal pressure $P_S$ is maintained to be higher than the internal pressure $P_0$ of the processing chamber, and performs a preprocessing step for cleaning the wiring pattern on the substrate using a desired cleaning gas, and an embedding step in which, after the preprocessing step, a clustered metal gas is generated by ejecting a metal source into the processing chamber from the gas nozzle and metal nanoparticles are embedded in the wiring pattern using the clustered metal gas.

While the invention has been shown and described with respect to the embodiments, it will be understood by those skilled in the art that various changes and modification may be made without departing from the scope of the invention as defined in the following claims.

For example, the substrate wiring method in accordance with the above-described embodiment has been used in three-dimensional wiring using the TSV and the embedding of Cu in a wiring process of a dual damascene structure, but can also be applied to any wiring on the substrate without being limited thereto.

In addition, the wiring pattern in accordance with the present invention is not limited to grooves or holes, and may have any shape.

Further, in the substrate wiring method in accordance with the above-described embodiment, the wiring layer has been formed of Cu, but the wiring layer may be formed of another metal without being limited thereto.

The substrate in accordance with the present invention may be a semiconductor wafer W or a flat panel display (FPD).

The cluster apparatus in accordance with the present invention may include an ionizer and an accelerator. In this case, the clustered metal gas is supplied from the gas nozzle, ionized by the ionizer, accelerated by the accelerator, and is supplied perpendicularly to the surface of the wafer W held by the holding member 155. This mechanism is referred to as a gas cluster ion beam (GCIB).

What is claimed is:

1. A substrate wiring method for wiring a substrate on which a wiring pattern is formed in a processing chamber maintained in a vacuum state, comprising:
    a preprocessing step in which the wiring pattern on the substrate is cleaned using a desired cleaning gas; and
    an embedding step in which, after the preprocessing step, metal nanoparticles are embedded in the wiring pattern using a clustered metal gas,
    wherein the embedding step includes forming a barrier material of metal by embedding the metal nanoparticles in a surface of the wiring pattern, and embedding a wiring metal in the wiring pattern in which the barrier material is formed, and
    wherein in the embedding step, the clustered metal gas is formed by ejecting a metal source into the processing chamber from a gas nozzle whose internal pressure $P_S$ is maintained to be higher than an internal pressure $P_0$ of the processing chamber.

2. The substrate wiring method of claim 1, wherein the inner pressure $P_S$ of the gas nozzle is equal to or greater than 0.4 MPa and the internal pressure $P_0$ of the processing chamber is equal to or less than 1.5 Pa.

3. The substrate wiring method of claim 1, wherein the inner pressure $P_S$ of the gas nozzle is equal to or less than 0.9 MPa.

4. The substrate wiring method of claim 1, wherein the substrate wiring method is used in a wiring process in a semiconductor chip or a wiring process between semiconductor chips.

5. A semiconductor manufacturing device for carrying out the substrate wiring method of claim 1, comprising:
    a gas nozzle whose internal pressure $P_S$ is maintained to be higher than an internal pressure $P_0$ of the processing chamber,
    wherein the semiconductor manufacturing device is configured to perform the preprocessing step and the embedding step,
    wherein the semiconductor manufacturing device is configured to clean, in the preprocessing step, the wiring pattern on the substrate by using the cleaning gas, and
    wherein the semiconductor manufacturing device is configured to generate, in the embedding step, the clustered metal gas by ejecting a metal source into the processing chamber from the gas nozzle.

6. The substrate wiring method of claim 1, wherein a distance d between the gas nozzle and the substrate is set to be longer than a distance $X_m$ from an outlet of the gas nozzle to a position where a shock wave is generated, which is defined in the following Eq. 1:

$$\frac{X_m}{D_O} = 0.67 \times \left(\frac{P_O}{P_S}\right)^{\frac{1}{2}} \qquad \text{Eq. 1}$$

where $D_O$ is an inner diameter of the outlet of the gas nozzle, $P_S$ is an inner pressure of the gas nozzle, and $P_0$ is an inner pressure of the processing chamber, and
    wherein the barrier material is formed by allowing the metal nanoparticles to collide with the substrate by using the generated shock wave.

7. A substrate wiring method for wiring a substrate on which a wiring pattern is formed in a processing chamber maintained in a vacuum state, comprising:
- a preprocessing step in which the wiring pattern on the substrate is cleaned using a desired cleaning gas; and
- an embedding step in which, after the preprocessing step, metal nanoparticles are embedded in the wiring pattern using a clustered metal gas,
- wherein the embedding step includes forming a barrier material of metal by embedding the metal nanoparticles in a surface of the wiring pattern, and embedding a wiring metal in the wiring pattern in which the barrier material is formed,
- wherein a distance d between the gas nozzle and the substrate is set to be longer than a distance $X_m$ from an outlet of the gas nozzle to a position where a shock wave is generated, which is defined in the following Eq. 1:

$$\frac{X_m}{D_O} = 0.67 \times \left(\frac{P_O}{P_S}\right)^{\frac{1}{2}} \qquad \text{Eq. 1}$$

where $D_O$ is an inner diameter of the outlet of the gas nozzle, $P_S$ is an inner pressure of the gas nozzle, and $P_O$ is an inner pressure of the processing chamber, and
- wherein the barrier material is formed by allowing the metal nanoparticles to collide with the substrate by using the generated shock wave.

8. The substrate wiring method of claim 7, wherein the inner pressure $P_S$ of the gas nozzle is equal to or greater than 0.4 MPa and the internal pressure $P_O$ of the processing chamber is equal to or less than 1.5 Pa.

9. The substrate wiring method of claim 7, wherein the inner pressure $P_S$ of the gas nozzle is equal to or less than 0.9 MPa.

10. The substrate wiring method of claim 7, wherein the substrate wiring method is used in a wiring process in a semiconductor chip or a wiring process between semiconductor chips.

11. A semiconductor manufacturing device for carrying out the substrate wiring method of claim 7, comprising:
- a gas nozzle whose internal pressure $P_S$ is maintained to be higher than an internal pressure $P_O$ of the processing chamber,
- wherein the semiconductor manufacturing device is configured to perform the preprocessing step and the embedding step,
- wherein the semiconductor manufacturing device is configured to clean, in the preprocessing step, the wiring pattern on the substrate by using the cleaning gas, and
- wherein the semiconductor manufacturing device is configured to generate, in the embedding step, the clustered metal gas by ejecting a metal source into the processing chamber from the gas nozzle.

12. A semiconductor manufacturing device for wiring a substrate on which a wiring pattern is formed in a processing chamber maintained in a vacuum state, comprising:
- a gas nozzle whose internal pressure $P_S$ is maintained to be higher than an internal pressure $P_O$ of the processing chamber,
- wherein the semiconductor manufacturing device performs a preprocessing step in which the wiring pattern on the substrate is cleaned using a desired cleaning gas; and
- an embedding step in which, after the preprocessing step, a clustered metal gas is generated by ejecting a metal source into the processing chamber from the gas nozzle and metal nanoparticles are embedded in the wiring pattern using a clustered metal gas, and
- wherein the semiconductor manufacturing device performs, in the embedding step, forming a barrier material of metal by embedding the metal nanoparticles in a surface of the wiring pattern, and embedding a wiring metal in the wiring pattern in which the barrier material is formed.

* * * * *